April 6, 1965 H. W. ABBOTT ET AL 3,177,350

TRANSISTORIZED STEP MULTIPLIER

Filed May 31, 1961

INVENTORS:
HAROLD W. ABBOTT,
VERNON P. MATHIS,

BY Marvin A. Goldenberg

THEIR ATTORNEY.

United States Patent Office 3,177,350
Patented Apr. 6, 1965

3,177,350
TRANSISTORIZED STEP MULTIPLIER

Harold W. Abbott, Syracuse, and Vernon P. Mathis, Baldwinsville, N.Y., assignors to General Electric Company, a corporation of New York Filed May 31, 1961, Ser. No. 113,808
9 Claims. (Cl. 235—152)

The invention relates to an improved function generator which obtains an accurate function of two independently varying input quantities, wherein one quantity is analog and the other is digital. In particular, the invention relates to an improved multiplier circuit of simplified construction for multiplying an analog and digital quantity to obtain an extremely accurate product at the output.

The invention constitutes an improvement of a step multiplier circuit of the type disclosed by E. A. Goldberg in an article entitled "Step Multiplier and Guided Missile Computer" appearing in Electronics, August 1951, wherein a digital input signal is employed to regulate the gain of a variable gain amplifier having an analog signal supplied as a second input. The above referenced circuit employs a shunt type feedback resistance network in a vacuum tube amplifier for providing the variable gain and the circuitry is relatively complex.

The present invention employs a series type feedback resistance network to which there accrues a number of advantages. For example, with a series feedback connection the amplifier readily presents a high input impedance, thereby permitting employment of a voltage source to provide the analog input, which is desirable. In addition, the feedback resistance is tied to a fixed reference voltage, rather than left floating, which permits direct and simplified circuitry to electrically vary the effective resistance of the feedback network. The invention also employs a novel compensation circuit for providing a more precise variation of the effective resistance in the feedback network.

Accordingly, it is an object of the present invention to provide an improved function generator to which may be applied independently varying analog and digital input quantities, which generator is of simplified construction and provides an extremely accurate output signal.

It is another object of the invention to provide an improved transistor multiplier circuit including a variable gain amplifier for multiplying a digital quantity and an analog quantity by varying the gain of the amplifier in accordance with the digital quantity, said multiplier circuit being of simplified construction and extreme accuracy.

It is another object of the invention to provide a multiplier circuit as indicated in the preceding object having a compensation network for improving the accuracy of the amplifier gain variations as determined by the digital input signal applied to the multiplier circuit.

Briefly, in accordance with one aspect of the invention an analog quantity is multiplied by a digital quantity to provide an accurate product by employing a variable gain amplifier, applying the analog quantity as one input thereto and varying the gain of the amplifier in accordance with the digital quantity. The variable gain amplifier includes first and second complementary transistors connected in a high current amplification configuration wherein the collector and emitter electrodes of the first transistor are connected to the base and collector electrodes respectively of the second transistor, with the analog quantity being connected as a voltage between the base electrode of the first transistor and a fixed reference voltage. A controllable resistance network including a parallel connection of a plurality of resistors serially connected to electronic switches is coupled between the common connection of the emitter and collector electrodes of said first and second transistors and said reference voltage. The digital quantity controls the value of the parallel resistance switched into the circuit. In one exemplary embodiment control is effected by means of a binary counter, each stage of which is coupled to actuate an associated switch of the resistance network. By a proper selection of the resistor values and a proper sequencing of switch operation, the effective parallel resistance is made inversely proportional, and accordingly the gain of the amplifier directly proportional, to the count of the binary counter. The output product signal appears as a current at the emitter electrode of the second transistor.

In accordance with a second aspect of the invention a compensation circuit including a plurality of compensation resistors and a second pair of transistors responsive to said analog voltage and of similar configuration to the first pair is connected to the junction of the network resistors and their serially connected electronic switches for shunting undesired leakage and storage currents of the switching transistors around the resistors of the controllable reistance network for improving the operation of the switching transistors.

While the specification concludes with claims particularly pointing out and distinctly claiming the subject matter which is regarded as the invention, it is believed that the invention will be better understood from the following description taken in connection with the accompanying drawings in which:

Figure 1:
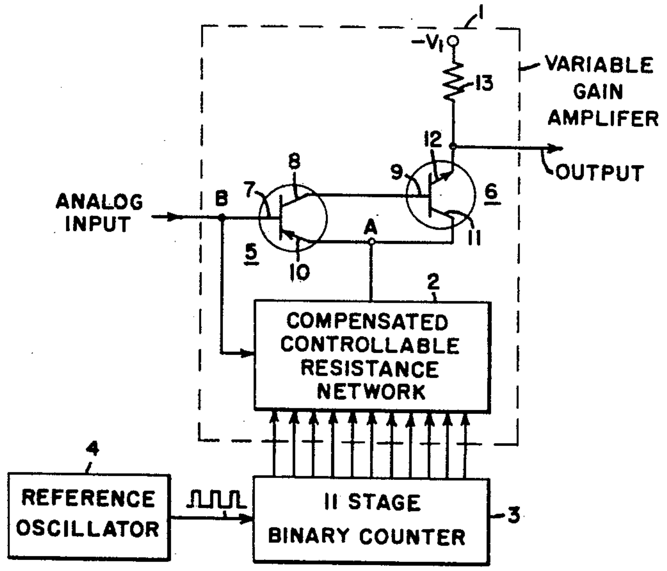
FIGURE 1 is a schematic block diagram of an improved multiplier circuit in accordance with the invention.

Considering now a detailed description of the invention, in FIGURE 1 is illustrated a function generator which includes a variable gain amplifier 1 having an analog quantity applied as a first input in the form of a voltage between point "B" and a ground point, and as a second input there is applied a digital quantity which controls the magnitude of the resistance of a compensated controllable resistance network 2. Variations in the resistance of network 2 vary the gain of amplifier 1 to provide at the output a product function of the two input quantities.

The resistance network 2 comprises a parallel resistor matrix, each resistor thereof being connected in series with an electronic switch. This network will be described in detail when considering FIGURE 2. In one exemplary mode of the operation the total effective parallel resistance $R_p$ of network 2 is controlled by means of a binary counter 3. The counter is driven by a sequence of pulses from a reference oscillator 4. The binary counter 3 is of conventional transistor design, comprising in this embodiment 11 stages of cascaded multivibrator circuits. The reference oscillator is a conventional transistor crystal oscillator satisfactory for driving the 11 stage counter. The output of each of the stages of the binary counter 3 is coupled to the resistance network 2 for controlling the actuation of the electronic switches, thereby inserting in the circuit parallel combinations of resistance of the resistor matrix.

The variable gain amplifier 1 includes a PNP transistor 5 and an NPN transistor 6 connected together so as to provide an extremely high linear current amplification device. The analog input signal is connected between point "B," at the base electrode 7 of transistor 5, and ground, for causing conduction in both transistors 5 and 6. The analog signal is also connected to the resistance network 2 for energizing the compensation portion thereof, shown in FIGURE 2. The collector 8 of transistor 5 is connected to base 9 of transistor 6 and the emitter 10 of transistor 5 is connected to the collector 11 of transistor 6. The emitter 12 of transistor 6 is connected through a load resistor 13 to a $-V_1$ potential, emitter 12 also being connected to the output terminal of the circuit. The emitter circuit of transistor 5, in common with the collector circuit of transistor 6, has connected therein the compensated controllable resistance network 2 which is coupled between point "A" and a ground point.

Considering the operation of the circuit of FIGURE 1, the analog quantity applied between point "B" and ground may be expressed as a voltage.

$$V=K_1S_1 \tag{1}$$

where $S_1$ represents some initial analog quantity and $K_1$ is a constant. This signal is amplified by the variable gain amplifier 1 in accordance with the gain of the amplifier as determined by the magnitude of the parallel resistance $R_p$ of network 2. When $R_p$ is made to be inversely related to the applied digital quantity, a product of the two applied quantities is obtained at the output. Thus, $$R_p=\frac{K_2}{S_2} \tag{2}$$

where $S_2$ is the digital quantity and $K_2$ is a constant. Since the transistor connections of amplifier 1 provide an exceedingly high current amplification, on the order of 1000 or greater, the output current $I_0$ at emitter 12 may be expressed as $$I_0=\frac{V}{R_p} \tag{3}$$

and substituting for V and $R_p$ from Equations 1 and 2

$$I_0=\frac{K_1S_1S_2}{K_2}=KS_1S_2 \tag{4}$$

where K is a new constant. Thus, the output current is seen to be a function of the product of the two input quantities.

The magnitude of $R_p$ is controlled by the binary counter 3 which during counting provides an output from each of its 11 stages to associated switches of the resistance network 2 for switching in and out the resistors thereof. The counting is in response to a succession of trigger pulses applied to the first stage of the binary counter from reference oscillator 4. As will be seen when considering FIGURE 2, the values of the individual resistors are proportioned such that $R_p$ is inversely related to the count.

Figure 2:
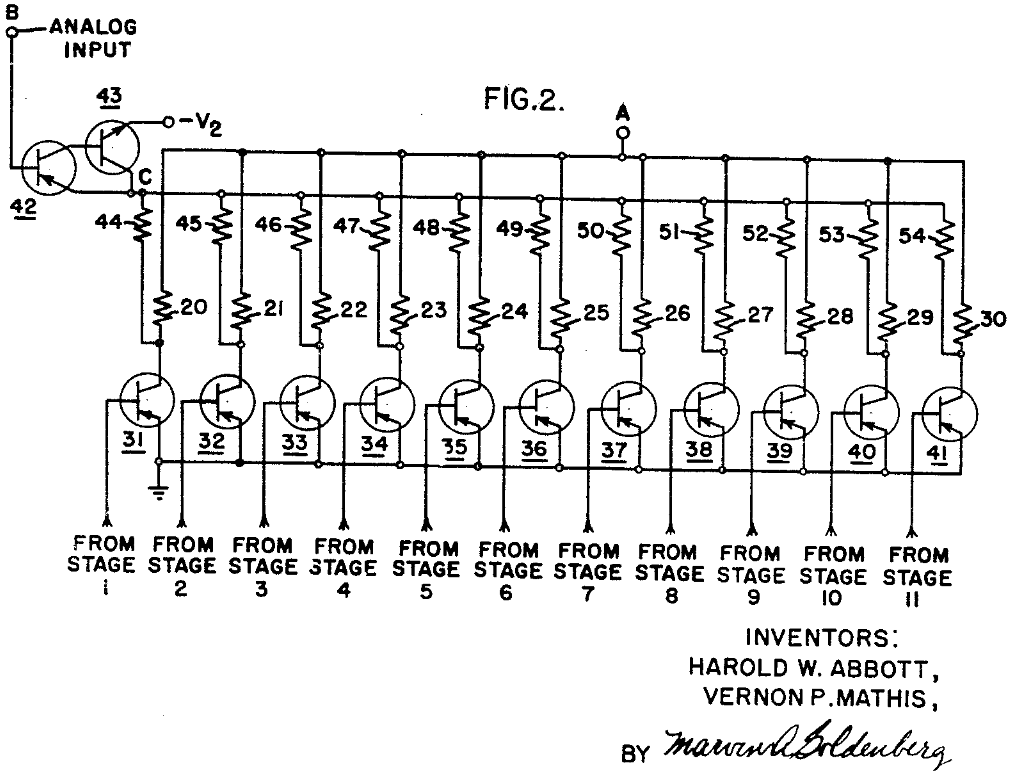
FIGURE 2 is a detailed illustration of the compensated controllable resistance network of FIGURE 1.

Referring now to FIG. 2, there is illustrated in detail the circuitry of the compensated controllable resistance network 2 of FIGURE 1. The resistor matrix includes resistors 20, 21, 22, 23, 24, 25, 26, 27, 28, 29 and 30 which are coupled by switching transistors 31, 32, 33, 34, 35, 36, 37, 38, 39, 40 and 41, respectively, from point "A" to ground. Transistors 31 through 41 are actuated by the outputs of stages 1 to 11, respectively, of the binary counter which selectively apply negative pulses to the base electrodes of the transistors.

Since transistors are not perfect switches, they tend to introduce error components in the output signal. The error components result from static leakage currents through the transistors when in the switch "open" condition, and transient carrier storage currents effective during the switching period, being conducted through resistors 20 to 30 of the resistor matrix. These error currents are minimized by providing a compensation circuit which includes transistors 42 and 43 and compensation resistors 44, 45, 46, 47, 48, 49, 50, 51, 52, 53 and 54. The compensation circuit shunts the undesired leakage and storage currents around the resistors of the controllable resistance network through the transistors 52 and 43, thereby substantially improving the operation of the transistors as switches, and consequently the accuracy of the overall circuit.

Although a portion of the desirable currents flowing through the switching transistors are also shunted through the compensation circuit, this does not interfere with the proper operation of the multiplier since the currents in the compensation resistors do not contribute to the output.

The transistors 42 and 43 are connected in a high current amplification configuration similar to the connection of transistors 5 and 6 and are biased for conduction in accordance with the analog imput. The emitter of transistor 42 is connected to the collector of transistor 43 at a common point "C," the collector of transistor 42 is connected to the base of transistor 43, the base of transistor 42 is connected to point "B," and the emitter 43 is connected to a $-V_2$ potential which is slightly more negative than the largest analog input signal. Compensation resistors 44 through 54 are connected from point "C" to the collector electrodes of transistors 31 through 41 respectively. As significant characteristics of transistors 42 and 43, they do not permit the compensation circuit to load the analog signal, and they ensure the voltage at point "C" to be always approximately equal to the voltage at point "A" so as to prevent unwanted circulating currents through the resistors of the matrix.

In one exemplary embodiment of the invention the following circuit parameters, which are presented merely for purposes of illustration, are employed:

| | | |
|---|---|---|
| Transistors **5** and **42** | | Type 2N495 |
| Transistors **6** and **43** | | Type 2N543 |
| Transistors **31** to **41** | | Type 2N404A |
| Resistor **20** | Kohms | 1,024 |
| Resistor **21** | do | 512 |
| Resistor **22** | do | 256 |
| Resistor **23** | do | 128 |
| Resistor **24** | do | 64 |
| Resistor **25** | do | 32 |
| Resistor **26** | do | 16 |
| Resistor **27** | do | 8 |
| Resistor **28** | do | 4 |
| Resistor **29** | do | 2 |
| Resistor **30** | do | 1 |
| Resistors **44** to **54** | do | 6.8 |
| Voltage source $-V_1$ | volts | $-30$ |
| Voltage source $-V_2$ | do | $-15$ |

In determining the range for $R_p$, it is required that the minimum value thereof be large as compared to the output impedance of the amplifier 1 at point A and sufficiently large so that the input impedance of amplifier 1 does not load the analog input signal, and the maximum value be such that the transistor leakage does not effect the performance of the circuit. Thus, for the recited parameters, $R_p$ extends over a range of 500 ohms to 1,024 Kohms.

Although the circuit has been described as performing a multiplication function, diverse other functions may be obtained by properly relating the resistor matrix and binary counter operation to the digital input quantity. For example, a ramp waveform may be readily obtained by the circuit of FIGURE 1 by varying the digital quantity uniformly with time and applying a fixed analog input. A precise square law waveform may be obtained by multiplying two ramp type waveforms, where the output of a first multiplier circuit provides the analog input to a second multiplier circuit.

In addition, although transistors have been employed to provide the switching operation, other types of electronic switches may be used, such as diode bridges.

The invention is not limited to the embodiment shown but is defined by the appended claims which are intended to include all modifications that fall within the true spirit and scope of the invention.

What we claim as new and desire to secure by Letters Patent of the United States is:

1. A variable gain amplifier for providing a predetermined function of independently varying analog and digital quantities comprising a semiconductor device having first and second input electrodes and an output electrode, said device exhibiting high current amplification, means for applying said analog quantity in the form of a voltage between said first input electrode and a reference point, a digital to analog impedance matrix connected between said second input electrode and said reference point, and means for electrically varying the impedance of said matrix in accordance with said digital quantity whereby an output signal at said output electrode provides said predetermined function.

2. A variable gain amplifier for providing a predetermined function of independently varying analog and digital quantities comprising first and second complementary transistors each having base, emitter and collector electrodes, the collector electrode of said first transistor being connected to the base electrode of said second transistor at a first juncture and the emitter electrode of said first transistor being connected to the collector electrode of said second transistor at a second juncture to provide a high current amplification device, means for applying said analog quantity in the form of a voltage between the base electrode of said first transistor and a reference point, and impedance matrix connected between said second juncture and said reference point, and means for electrically varying the impedance of said matrix in accordance with said digital quantity whereby an output signal at the emitter electrode of said second transistor provides said predetermined function.

3. A variable gain amplifier as in claim 2 wherein said impedance matrix derives an analog quantity and includes the parallel combination of a plurality of resistors serially connected to electronic switches.

4. A variable gain amplifier as in claim 3 which includes a compensation means coupled to the junctions of said resistors and electronic switches for shunting undesirable static and transient currents conducted by said switches around said resistors thereby improving the accuracy of the output signal.

5. A variable gain amplifier as in claim 4 wherein said electronic switches are transistor devices.

6. A function generator for providing a predetermined function of independently varying analog and digital quantities comprising a first variable gain amplifier including first and second complementary transistors each having base, emitter and collector electrodes, the collector electrode of said first transistor being connected to the base electrode of said second transistor at a first juncture and the emitter electrode of said first transistor being connected to the collector electrode of said second transistor at a second juncture to provide a high current amplification device, means for applying said analog quantity in the form of a voltage between the base electrode of said first transistor and a reference point, a digital to analog impedance matrix connected between said second juncture and said reference point, said impedance matrix including the parallel combination of a plurality of resistors serially connected to electronic switches, means for electrically varying the impedance of said matrix by selectively energizing said switches in accordance with said digital quantity to obtain an output signal at the emitter electrode of said second transistor which provides said predetermined function, compensation means including a plurality of compensation resistors coupled from the junctions of the matrix resistors and the serially connected switches through a second variable gain amplifier responsive to said analog quantity for shunting undesirable static and transient currents conducted by said switches around said matrix resistors, whereby the accuracy of said output signal is improved.

7. A function generator as in claim 6 wherein said second variable gain amplifier is a high current amplification device connected to present a high input impedance to the analog voltage.

8. A multiplier circuit for multiplying an analog quantity by a digital quantity comprising a first variable gain amplifier including first and second complementary transistors each having base, emitter and collector electrodes, the collector electrode of said first transistor being connected to the base electrode of said second transistor at a first juncture and the emitter electrode of said first transistor being connected to the collector electrode of said second transistor at a second juncture to provide a high current amplification device, means for applying said analog quantity in the form of a voltage between the base electrode of said first transistor and a reference point, an impedance matrix connected between said second juncture and said reference point, said impedance matrix including the parallel combination of a plurality of resistors serially connected to electronic switches, means for electrically varying the impedance of said matrix by selectively energizing said switches in accordance with said digital quantity to provide an output signal at the emitter electrode of said second transistor which is a function of the product of said two quantities, a plurality of compensation resistors having one common terminal, the other terminals thereof being connected respectively to the junctions of the matrix resistors and the serially connected switches, a second variable gain amplifier including third and fourth complementary transistors each having base, emitter and collector electrodes, the collector electrode of said third transistor being connected to the base electrode of said fourth transistor and the emitter electrode of said third transistor being connected to the collector electrode of said fourth transistor and to the common terminal of said compensation resistors, the base electrode of said third transistor being responsive to said analog quantity whereby undesirable currents conducted by said switches are shunted through said compensation resistors and said second variable gain amplifier to improve the accuracy of said output signal.

9. A multiplier circuit as in claim 8 wherein said electronic switches are transistor devices.

References Cited by the Examiner

UNITED STATES PATENTS

| | | | |
|---|---|---|---|
| 2,434,155 | 1/48 | Haynes | 235—197 |
| 2,898,411 | 8/59 | Chow | 330—29 |
| 2,976,527 | 3/61 | Smith | 235—154 X |

OTHER REFERENCES

Pages 121–124, 8/51—"Step Multiplier in Guided Missile Computer"; Goldberg; Electronics.

Pages 119, 120, 1947—"Mathematical Machines," Murray. Published by Columbia U.

Pages 226–228, 1952—"Electronic Analog Computers," Korn & Korn, published by McGraw-Hill.

Pages 150–151, and 320. "Transistor Circuit Analysis," Joyce et al. Published by Addison-Wesley.

Page 149, 1/61—"Transistor Circuit Analysis" (Joyce et al.) published by Addison-Wesley.

MALCOLM A. MORRISON, *Primary Examiner.*

WALTER W. BURNS, Jr., *Examiner.*